United States Patent
Chan et al.

(10) Patent No.: US 7,341,384 B2
(45) Date of Patent: Mar. 11, 2008

(54) FIBER OPTIC TRANSCEIVER MODULE HAVING BUILT-IN TEST CAPABILITY AND ASSOCIATED METHOD

(75) Inventors: Eric Y. Chan, Mercer Island, WA (US); Dennis G. Koshinz, Bellevue, WA (US)

(73) Assignee: The Boeing Company, Chicago, IL (US)

( * ) Notice: Subject to any disclaimer, the term of this patent is extended or adjusted under 35 U.S.C. 154(b) by 0 days.

(21) Appl. No.: 11/093,685

(22) Filed: Mar. 30, 2005

(65) Prior Publication Data
US 2006/0228078 A1    Oct. 12, 2006

(51) Int. Cl.
*G02B 6/36* (2006.01)
*G01N 21/88* (2006.01)

(52) U.S. Cl. .................... 385/89; 385/92; 356/73.1
(58) Field of Classification Search .............. 385/31, 385/89, 92, 88
See application file for complete search history.

(56) References Cited

U.S. PATENT DOCUMENTS

| | | | |
|---|---|---|---|
| 4,021,121 A | | 5/1977 | Schicketanz et al. |
| 5,179,420 A | * | 1/1993 | So et al. ............ 356/73.1 |
| 5,692,086 A | | 11/1997 | Beranek et al. |
| 6,081,638 A | * | 6/2000 | Zhou .................. 385/31 |
| 6,205,274 B1 | | 3/2001 | Zhou |
| 6,842,467 B1 | * | 1/2005 | Aronson et al. ......... 372/27 |
| 2003/0235366 A1 | | 12/2003 | Chan et al. |

OTHER PUBLICATIONS

PCT International Search Report, PCT/US2006/010973, dated Sep. 13, 2006.
Harres D N, High Speed Fiber Optic Transceivers With Built-In Test Capability, *Digital Avionics Systems Conference* Oct. 24-28, 2004, pp. 981-991.

* cited by examiner

*Primary Examiner*—Tina M. Wong
(74) *Attorney, Agent, or Firm*—Alston & Bird LLP

(57) ABSTRACT

A fiber optic transceiver module, having built-in test capability and a low physical profile that meets mil spec requirements, comprises a housing. The housing comprises an optical fiber having an angled end that defines an acute angle relative to the longitudinal axis of the optical fiber, an optical source for emitting an optical signal which is reflected by the angled end of the optical fiber and propagated along the optical fiber, and an optical detector for receiving a return optical signal transmitted through the angled end of the optical fiber in response to reflection from a discontinuity in the optical fiber. The acute angle may be 48 degrees, causing a desired portion of the signal emitted from the optical source to be propagated along the optical fiber and to cause a desired portion of the return optical signal to be transmitted through the angled end to a photodetector.

11 Claims, 2 Drawing Sheets

FIBER OPTIC TRANSCEIVER MODULE HAVING BUILT-IN TEST CAPABILITY AND ASSOCIATED METHOD

FIELD OF THE INVENTION

The present invention relates generally to fiber optic transceiver modules, and more particularly, to fiber optic transceiver modules having a low physical profile and built-in test capability.

BACKGROUND OF THE INVENTION

Newer generations of aircraft and other air and space vehicles, including military aircraft, are increasingly using fiber optic connections, rather than metallic wiring, for communications, weaponry, and other systems. Optical fiber connections provide faster communication and increased bandwidth. However, optical fiber can be more fragile than metallic wiring and can be damaged during installation or during the rigors of flight testing.

Damage to optical fiber can be difficult to distinguish from faults occurring in other components of the communication or weaponry systems. Even when it is known that the damage exists, it can be difficult to identify the precise location of the damage. These difficulties can increase the maintenance costs and reduce the operating efficiency of the aircraft.

One solution to decrease the maintenance costs of any complex system that uses fiber optic connections is to implement built-in test (BIT) capability. BIT capability may be incorporated directly into the fiber optic transceiver module that is otherwise responsible for transmitting and receiving signals via the associated optical fiber. In this regard, the fiber optic transceiver module may include hardware and/or software to identify the existence and location of damage to the associated optical fibers, thereby providing the BIT capability. The optical fiber can therefore be routinely tested for any discontinuities in the optical fiber that are indicative of damage. For example, the optical fiber can be tested every time the system is started. This ability to routinely test the optical fiber allows for fast identification and repair of damage, thereby increasing operating efficiency.

Hardware installed in military aircraft must meet exacting military specification (mil spec) requirements. One of the mil spec requirements for fiber optic transceiver modules is that the modules must have a low physical profile so as to occupy minimal space in the aircraft. For example, one current mil spec requirement limits the height of fiber optic transceiver modules to 140 mils or less (one mil equals one thousandth of an inch). This is in compliance with the requirements of the Standard Electronic Module Type E format for circuit cards used in line replaceable modules in commercial aircraft and in weapon replaceable modules in military aircraft.

One known method of implementing a low profile fiber optic transceiver is to use an optical fiber having an angled end face. The end face may be disposed at a variety of angles, but is typically disposed at about an angle of 45° relative to the longitudinal axis of the optical fiber. An optical fiber having an angled end face can be used to couple optical signals between various devices, such as various optoelectronic devices, including, for example, a photodiode or a vertical cavity surface emitting laser (VCSEL). The VCSEL controlled by a transmitter application specific integrated circuit (ASIC) would emit an optical signal in a first direction. The optical fiber would be positioned in an aligned relationship above the VCSEL so as to receive the optical signal and to transmit the optical signal to another device, such as another optoelectronic device including, for example a photodiode that functions as a receiver. Thus, this optical fiber establishes the communication link between the VCSEL-based transmitter and the photodiode receiver.

The optical fiber would receive the optical signal emitted by the VCSEL via an angled end face which redirects the optical signal along the length of the optical fiber, as described below. The angled end face of the optical fiber permits the optical signal emitted by the VCSEL to be totally internally reflected within the optical fiber as indicated by the dashed line. The fiber optic transceiver module would be contained in a housing and would exit the housing through a hermetically-sealed feed-through.

Advantageously, the spacing between the end face of the optical fiber and the VCSEL may be quite small, such as 50-100 microns, thereby potentially reducing the size and profile of the resulting package. Moreover, the optical fiber may be oriented such that the longitudinal axis of the optical fiber extends perpendicularly to the direction of the signals emitted by the VCSEL, thereby reducing the profile or height of the fiber optic transceiver module. The optical signal emitted by the VCSEL propagates through the side surface of the optical fiber and is internally reflected by the angled end face so as to then propagate lengthwise along the optical fiber. Thus, the angle at which the end face is disposed relative to the longitudinal axis of the optical fiber may vary, but is generally defined by Snell's law, such that the optical signal is totally internally reflected within the optical fiber.

By using an optical fiber having an angled end face, the optoelectronic devices, such as a VCSEL, a photodiode, or other optoelectronic device, may be disposed in a relatively small package having a low profile. The fiber optic transceiver module may also include other components, such as optoelectronic devices and other devices, including ASICs. The spacing between the VCSEL and the other components is also advantageously minimized, thereby allowing shorter electrical bond wires. Shorter bond wires correspondingly reduce parasitic capacitance and inductance, thereby increasing the potential speed at which the system may operate. The known fiber optic transceiver module described above achieves the required low physical profile, but does not incorporate BIT functionality.

In the absence of an optical fiber having an angled end face, the optical signal emitted by the VCSEL would generally be coupled to an optical fiber having a planar end face that extends perpendicularly to the longitudinal axis of the optical fiber itself. One known configuration would position the VCSEL with the fiber extending upwardly from the VCSEL for some distance before being gradually turned and redirected in the desired direction using bulk optical elements. Another known configuration would use a VCSEL mounted on a header such that the optical signal emitted by the VCSEL is oriented along the same axis as the optical fiber. Either of these known configurations would significantly increase the profile or height of the fiber optic transceiver module. Additionally, BIT functionality could not be implemented with either of these configurations.

While the conventional fiber optic transceiver described above provides a low physical profile to meet mil spec requirements, it does not provide BIT capability. Therefore it would be desirable to have a fiber optic transceiver module that meets the mil spec requirement of a low physical profile and also has built-in-test capability.

BRIEF SUMMARY OF THE INVENTION

A low profile fiber optic transceiver module of the present invention provides built-in test (BIT) capability. The preferred module satisfies the requirements of mil spec MIL-STD-1389D. In this regard, the fiber optic transceiver module comprises an optical fiber having an angled end, an optical source, and an optical detector. The angled end defines an acute angle relative to the longitudinal axis of the optical fiber. The optical source emits an optical signal which is reflected by the angled end of the optical fiber and propagated along the optical fiber. The optical detector receives a return optical signal transmitted through the angled end of the optical fiber in response to reflection from a discontinuity in the optical fiber.

The acute angle may be between 30 degrees and 60 degrees. Within such a range, the acute angle may be selected to cause a desired portion of the optical signal emitted from the optical source to be reflected by the angled end of the optical fiber and propagated along the optical fiber and to cause a desired portion of the return optical signal to be transmitted through the angled end. As such, the acute angle may be 48 degrees, thereby causing 50% of the optical signal emitted by the optical source to be reflected by the angled end and 50% of the return optical signal reflected by a discontinuity to be transmitted through the angled end.

The angled end may comprise a partially reflective coating. As such, the acute angle may be 45 degrees.

In one embodiment, the optical source is a vertical cavity surface emitting laser. The optical detector may comprise a photodetector.

In one embodiment, the fiber optic transceiver module may also comprise an optical time domain reflectometer (OTDR), responsive to the optical detector, for determining an elapsed time between emission of the optical signal and receipt of the return optical signal. The OTDR may be capable of determining a location of the discontinuity along the optical fiber based on the elapsed time.

The height of the fiber optic transceiver module may be equal to or less than 140 mils, thereby satisfying the requirements of mil spec MIL-STD-1389D.

In addition to the fiber optic transceiver module system having BIT capability as described above, other aspects of the present invention are directed to corresponding methods for conducting built-in testing of optical fibers.

BRIEF DESCRIPTION OF THE SEVERAL VIEWS OF THE DRAWING(S)

Figure 3:
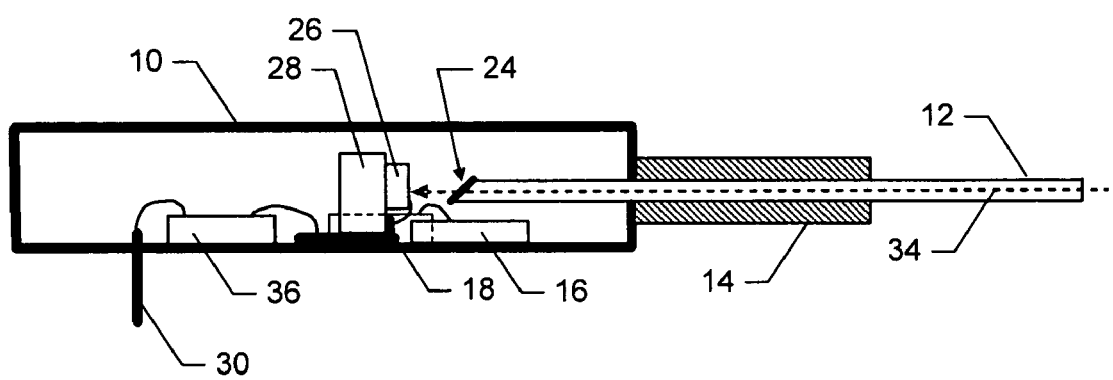

FIG. 3 is a cross-sectional side view of a fiber optic transceiver module of the present invention, illustrating the optical signal reflecting back from a discontinuity in the optical fiber for use in built-in testing of the optical fiber using an application specific integrated circuit (ASIC) or a field programmable gate array (FPGA) internal to the fiber optic transceiver performing the OTDR functionality.

DETAILED DESCRIPTION OF THE INVENTION

The present invention now will be described more fully with reference to the accompanying drawings, in which some, but not all embodiments of the invention are shown. This invention may be embodied in many different forms and should not be construed as limited to the embodiments set forth. Like numbers refer to like elements throughout.

In embodiments of the present invention, an optical source emits an optical signal that is reflected by an angled end of an optical fiber. The optical signal is propagated along the optical fiber by internal reflection. If the optical signal encounters a discontinuity in the optical fiber, at least a portion of the optical signal is reflected along the optical fiber back toward the angled end. When the reflected optical signal reaches the angled end, some portion of the reflected signal is transmitted through the angled end and is received by an optical detector. By analyzing the time that has elapsed from the emission of the optical signal by the optical source to the reception of the reflected signal by the optical detector, the existence and location of the discontinuity may be determined. The use of an angled end enables the fiber optic transceiver module to achieve BIT functionality without the need for additional optical components to split the optical signal, such as prisms and lenses.

Figure 1:
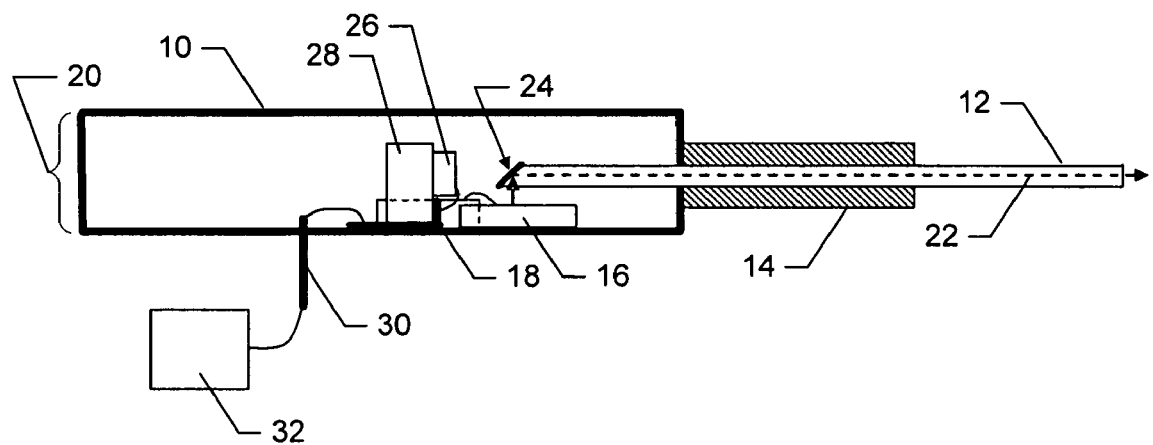
FIG. 1 is a cross-sectional side view of a fiber optic transceiver module of the present invention, illustrating the optical signal emitting from the VCSEL and propagating along the optical fiber.

FIG. 1 is a cross-sectional side view of a fiber optic transceiver module in accordance with one embodiment of the present invention. In addition to maintaining a low physical profile, such as required by the relevant mil specs, the fiber optic transceiver module incorporates BIT functionality.

As shown in FIG. 1, an optical source, such as a VCSEL 16, is disposed within a housing 10 and emits an optical signal in first direction, such as a vertical direction. While orientational designations such as vertical and horizontal are used in this application, these orientational designations are used for purposes of example and explanation and not of limitation since other orientations are also supported. In the embodiment of FIG. 1, the VCSEL is controlled by an ASIC 18 (which is partially obscured in FIG. 1 by the VCSEL 16 and the submount 28). However, the optical source may be controlled or activated in many other manners. The optical fiber 12 is positioned in an aligned relationship above the VCSEL so as to receive the optical signal and to transmit the optical signal to another device (not shown), such as another optoelectronic device including, for example a photodiode that functions as a receiver. Thus, this optical fiber establishes the communication link between the VCSEL-based transmitter and the photodiode receiver.

The fiber optic transceiver module includes an optical fiber 12 that is positioned in an aligned relationship with the optical signal emitted by the VCSEL. As shown, the optical fiber 12 includes an angled end face 24 that is aligned with the optical signal emitted by the VCSEL. The end face may be disposed at an angle of between approximately 30° and 60° relative to the longitudinal axis of the optical fiber. In this embodiment, the angled end face has a partially reflective coating. The partially reflective coating may be a thin film metal, multilayer dielectric, or any appropriate coating as is known in the art for increasing or decreasing reflectivity from an optical surface. The selected coating may be wavelength specific. The entire surface of the angled end face would typically have the partially reflective coating. Where the end face has a partially reflective coating, the angle of the end face would preferably be 45°. The optical fiber 12 receives the optical signal emitted by the VCSEL, and the angled end face 24 redirects a portion of the optical signal 22 emitted by the VCSEL such that the optical signal 22 is reflected within the optical fiber and propagates longitudinally along the optical fiber, as indicated by the dashed line. In the illustrated embodiment, the optical fiber then exits the housing through a hermetically-sealed feed-through 14.

Advantageously, the spacing between the end face of the optical fiber and the VCSEL may be quite small, such as 50-100 microns, thereby potentially reducing the size and profile of the resulting package. Moreover, the optical fiber may be oriented such that the longitudinal axis of the optical fiber extends perpendicularly to the direction of the signals emitted by the VCSEL, thereby reducing the profile or height 20 of the fiber optic transceiver module. The height 20 may be 140 mils or less, such that mil spec MIL-STD-1389D is satisfied. The optical signal emitted by the VCSEL propagates through the side surface of the optical fiber and is reflected by the angled end face so as to then propagate lengthwise along the optical fiber.

By using an optical fiber having an angled end face, the optoelectronic devices, such as a VCSEL, a photodiode, or other optoelectronic device, may be disposed in a relatively small package having a low profile. The fiber optic transceiver module may also include other components, such as optoelectronic devices and other devices, including ASICs. The spacing between the VCSEL and the other components is also advantageously minimized, thereby allowing shorter electrical bond wires. Shorter bond wires correspondingly reduce parasitic capacitance and inductance, thereby increasing the potential speed at which the system may operate.

In an alternative embodiment, the angled end face does not have a partially reflective coating. The angle of the end face controls how much of the optical signal emitted by the VCSEL is reflected by the angled end and is propagated along the optical fiber. A sufficient portion of the emitted optical signal should be propagated along the optical fiber to ensure the optical signal is received at the receiver located at the end of the optical fiber opposite the angled end. The angle of the end face also controls how much of the reflected optical signal is transmitted through the angled end to the optical detector. A sufficient portion of the reflected optical signal should be transmitted through the angled end to ensure the reflected optical signal is received by the optical detector. The angle of the end face may be selected to optimize both the amount of the emitted optical signal that is reflected by the angled end (to ensure the optical signal is received at the receiver when no discontinuity exists) and the amount of the reflected optical signal that is transmitted through the angled end to the optical detector 26 (to ensure the reflected optical signal is received by the optical detector when a discontinuity exists). The angle of the end face would preferably be 48° relative to the longitudinal axis of the optical fiber, such that 50% of the optical signal emitted by the VCSEL is reflected by the angled end and propagated along the optical fiber, and 50% of the optical signal reflected by a discontinuity is transmitted through the angled end. Because only 50% of the emitted signal is being propagated along the optical fiber, the drive current provided to the VCSEL may need to be increased, thereby causing a higher optical output power, to achieve the desired propagated optical signal.

In this alternative embodiment, if the angle of the end face is greater than 48°, less than 50% of the optical signal emitted by the VCSEL would likely be reflected by the angled end and more than 50% of the optical signal reflected by a discontinuity would likely be transmitted through the angled end to the optical detector. If the angle of the end face is less than 48°, more than 50% of the optical signal emitted by the VCSEL would likely be reflected by the angled end and less than 50% of the optical signal reflected by a discontinuity would likely be transmitted through the angled end to the optical detector 26.

Ideally, the optical fiber is continuous such that virtually no optical signal reflects back so as to propagate in a direction toward the source. In instances in which the optical fiber has been damaged or is otherwise defective, the optical fiber may not be continuous but may have a discontinuity, such as a breakage of the optical fiber. For example, the optical fiber may be fully or partly severed, or the optical fiber may be crushed. The discontinuity causes at least a portion of the optical signals to be reflected back in an upstream direction toward the optical source. As a result of the BIT capability of the fiber optic transceiver module of the present invention, this discontinuity may be detected.

Figure 2:
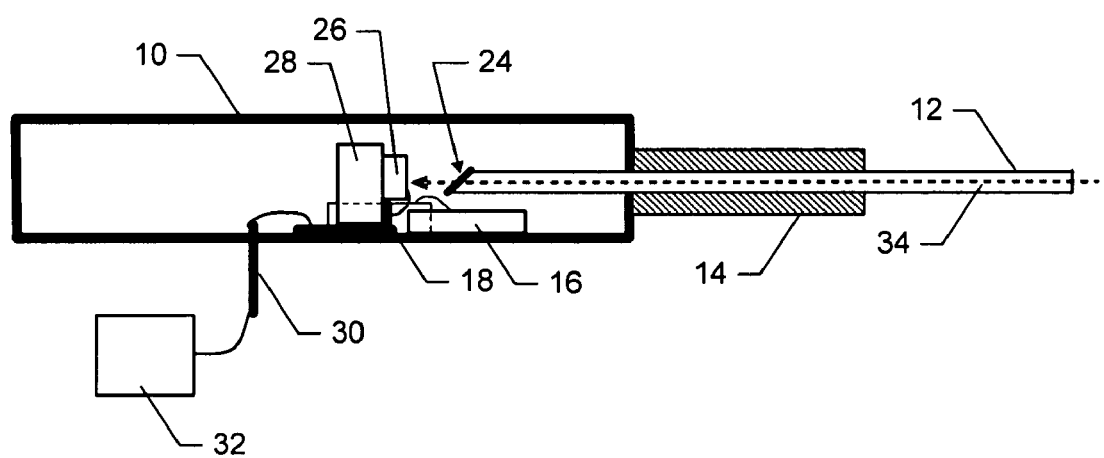
FIG. 2 is a cross-sectional side view of a fiber optic transceiver module of the present invention, illustrating the optical signal reflecting back from a discontinuity in the optical fiber for use in built-in testing of the optical fiber using an OTDR external to the optical fiber transceiver.

FIG. 2 shows the fiber optic transceiver module of FIG. 1 where the optical signal 34 emitted by the VCSEL 16 has been reflected back from a discontinuity in the optical fiber 12 (the discontinuity is not shown in the figures). A portion of the reflected optical signal exits the optical fiber through the angled end 24 since the coating of the angled end 24 is only partially reflective, and therefore, partially transmissive. As discussed above, the angle of the end face may be selected to permit a portion of the reflected optical signal to exit the optical fiber through the angled end without a partially reflective coating. In the embodiment of FIG. 2, the fiber optic transceiver module includes an optical detector 26. The optical detector 26 would typically comprise a photodetector, such as a p-type-intrinsic-n-type (PIN) photodiode, a P—N photodiode, an avalanche photodiode, or any other suitable photodetector known to those skilled in the art. As shown, the optical detector is positioned in alignment with the longitudinal axis of the optical fiber such that the optical signals transmitted through the angled end of the optical fiber are collected by the optical detector 26. The optical detector 26 may be mounted on a submount 28 and may be in electrical connection with package pin 30 or other connector, providing an electrical connection to devices external to the housing 10. In this embodiment, the package pin connects to an optical time domain reflectometer (OTDR) 32, although the output of the optical detector may be directed to other computing devices. The optical signal reflected by the discontinuity is received by the optical detector 26. The optical detector provides an output representative of the received signal. The output of the optical detector 26 is transmitted via the package pin 30 to the OTDR 32. The OTDR 32 may comprise a circuit (e.g., an application specific integrated circuit or a field programmable gate array) or instrumentation.

The OTDR can analyze the signal from the optical detector to determine the location of the discontinuity. In one embodiment, the ASIC 18 would send a signal to the VCSEL 16 to cause the VCSEL to emit a high speed, narrow optical pulse to test the continuity of the optical fiber 12. The optical detector detects the first pulse emitted by the VCSEL and uses the first pulse as a start time reference. If the optical pulse is reflected by a discontinuity in the optical fiber, the optical detector 26 would receive the reflected signal and send a signal to the OTDR that a reflected signal was received. The OTDR could then calculate a time difference from when the optical pulse was emitted to when the reflected optical pulse was received. The known speed of the optical signal and the calculated time difference between the emission of the optical pulse and the reception of the reflected optical pulse could be used to calculate an approximate total distance traveled by the optical pulse and the reflected optical pulse. Dividing the total distance in half would provide an approximate distance along the optical fiber from the VCSEL to the discontinuity, thereby providing an approximate location of the discontinuity. Knowing the approximate location of the discontinuity allows maintenance personnel to quickly access and repair or replace the damaged optical fiber. If the optical detector does not receive a reflected pulse within a predefined time period, then there is likely no discontinuity within the optical fiber.

In the embodiment of FIG. 2, the OTDR 32 or other processing element is external to the housing 10. As shown in FIG. 3, an ASIC 36 (or an FPGA) may be contained within the housing 10 and may provide OTDR functionality. The fiber optic transceiver module may also include a package pin 30 or other connector to provide output from the ASIC providing the OTDR functionality to an external system, such as an avionic mission computer.

By analyzing any reflected signal, it is possible to determine if there is a discontinuity within the optical fiber, and to determine the approximate location of the discontinuity. Routine testing of the optical fiber may be performed to quickly identify and locate discontinuities, thereby facilitating faster repairs and increasing operational efficiency. Advantageously, a low physical profile is maintained, thereby ensuring continued compliance with mil specs, while achieving BIT capability.

Embodiments of the present invention may also be used as a portable OTDR to test for discontinuity of an existing optical fiber in an optical fiber system that does not have BIT capability. A fiber optic transceiver module may have an optical source, an optical detector, an OTDR ASIC, and an internal optical fiber having an angled end face and connected to an optical-to-optical connector. The optical-to-optical connector of such a module may be connected to an existing optical fiber. A test pulse may be emitted by the optical source, reflected by the angled end face, propagated along the internal optical fiber, propagated through the optical-to-optical connector, and propagated along the existing optical fiber. A signal reflected from a discontinuity in the existing optical fiber would be propagated back through the optical-to-optical connector and the internal optical fiber, would be partially transmitted through the angled end face, and received by the optical detector. Some portion of the test pulse would likely be reflected by the optical-to-optical connector. As the distance to the optical-to-optical connector is known and thus the propagation time is known, this reflected signal may be ignored by the OTDR ASIC.

The invention is not limited to the specific disclosed embodiments. Although specific terms are employed in this application, they are used in a generic and descriptive sense only and not for purposes of limitation.

That which is claimed:

1. A portable fiber optic transceiver module having built-in test capability comprising:
   a housing sized to be portable;
   an internal optical fiber having an angled end that defines an acute angle relative to a longitudinal axis of the internal optical fiber;
   an optical source for emitting an optical signal which is reflected by the angled end of the internal optical fiber and propagated along the internal optical fiber;
   an optical-to-optical connector for connecting the internal optical fiber to an existing optical fiber of an optical fiber system that lacks built-in-test (BIT) capability;
   an optical detector for receiving a return optical signal transmitted through the angled end of the internal optical fiber in response to reflection from a discontinuity in the existing optical fiber; and
   an optical time domain reflectometer (OTDR), responsive to the optical detector, for determining an elapsed time between emission of the optical signal and receipt of the return optical signal and for determining a location of the discontinuity in the existing optical fiber based on the elapsed time, wherein the OTDR is also configured to distinguish the return optical signal generated by a discontinuity in the existing optical fiber from any return optical signal generated at the optical-to-optical connector such that the OTDR is configured to ignore any return optical signal generated at the optical-to-optical connector.

2. The fiber optic transceiver module of claim 1, wherein the acute angle is between 30 degrees and 60 degrees.

3. The fiber optic transceiver module of claim 1, wherein the acute angle is selected to cause a predefined portion of the optical signal emitted from the optical source to be reflected by the angled end of the internal optical fiber and propagated along the internal optical fiber and to cause a predefined portion of the return optical signal to be transmitted through the angled end.

4. The fiber optic transceiver module of claim 3, wherein the acute angle is 48 degrees.

5. The fiber optic transceiver module of claim 1, wherein the angled end comprises a partially reflective coating.

6. The fiber optic transceiver module of claim 5, wherein the acute angle is 45 degrees.

7. The fiber optic transceiver module of claim 1, wherein the optical source comprises a vertical cavity surface emitting laser.

8. The fiber optic transceiver module of claim 1, wherein the optical detector comprises a photodetector.

9. The fiber optic transceiver module of claim 1, further comprising a housing having a height that is equal to or less than 140 mils.

10. A method for built-in testing of an existing optical fiber, the method comprising:
    connecting a portable fiber optic transceiver module having an internal optical fiber and an optical-to-optical connector for connecting the internal optical fiber to the existing optical fiber of an optical fiber system that lacks built-in-test (BIT) capability;
    emitting an optical pulse toward the internal optical fiber having an angled end that defines an acute angle relative to a longitudinal axis of the internal optical fiber, such that the optical pulse is reflected by the angled end of the optical fiber and propagated along both the internal optical fiber and the existing optical fiber;
    receiving a return optical pulse by an optical detector, wherein the return optical pulse is transmitted through the angled end of the optical fiber in response to reflection from a discontinuity in the optical fiber; and
    providing an optical time domain reflectometer (OTDR), responsive to the optical detector, which is configured to determine an elapsed time between emission of the optical pulse and receipt of the return optical pulse and to determine a location of the discontinuity in the optical fiber based on the elapsed time; and
    distinguishing the return optical signal generated by the discontinuity in the existing optical fiber from any return optical signal generated at the optical-to-optical connector such that the OTDR is configured to ignore any return optical signal generated at the optical-to-optical connector.

11. The method of claim 10, wherein the acute angle is selected to cause a predefined portion of the optical pulse emitted from the optical source to be reflected by the angled end of the optical fiber and propagated along the optical fiber and to cause a predefined portion of the return optical signal to be transmitted through the angled end.

* * * * *